(12) United States Patent
Cha et al.

(10) Patent No.: US 6,537,901 B2
(45) Date of Patent: Mar. 25, 2003

(54) METHOD OF MANUFACTURING A TRANSISTOR IN A SEMICONDUCTOR DEVICE

(75) Inventors: Tae Ho Cha, Kyungki-Do (KR); Se Aug Jang, Kyungki-Do (KR); Tae Kyun Kim, Kyungki-Do (KR); Dea Gyu Park, Kyungki-Do (KR); In Seok Yeo, Kyungki-Do (KR); Jin Won Park, Chungcheongbuk-Do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 09/887,511

(22) Filed: Jun. 25, 2001

(65) Prior Publication Data

US 2002/0123189 A1 Sep. 5, 2002

(30) Foreign Application Priority Data

Dec. 29, 2000 (KR) .......................................... 2000-85138
Dec. 29, 2000 (KR) .......................................... 2000-85175

(51) Int. Cl.[7] .................. H01L 21/3205; H01L 21/4763
(52) U.S. Cl. ..................... 438/592; 438/584; 438/585
(58) Field of Search .............................. 438/584, 585, 438/683, 592

(56) References Cited

U.S. PATENT DOCUMENTS

| | | | | | |
|---|---|---|---|---|---|
| 6,040,610 | A | * | 3/2000 | Noguchi et al. ............ | 257/314 |
| 6,043,537 | A | * | 3/2000 | Jun et al. .................... | 257/350 |
| 6,083,780 | A | * | 7/2000 | Yasuda ........................ | 438/683 |
| 6,124,190 | A | * | 9/2000 | Yamamoto et al. ......... | 438/592 |
| 6,130,123 | A | | 10/2000 | Liang et al. ................ | 438/217 |
| 6,166,417 | A | * | 12/2000 | Bai et al. .................... | 257/388 |
| 6,168,997 | B1 | * | 1/2001 | Tseng ......................... | 438/592 |
| 6,171,910 | B1 | * | 1/2001 | Hobbs et al. ............... | 438/585 |
| 6,177,335 | B1 | * | 1/2001 | Park et al. .................. | 438/584 |
| 6,225,168 | B1 | * | 5/2001 | Gardner et al. ............. | 438/592 |
| 6,265,258 | B1 | * | 7/2001 | Liang et al. ................ | 438/217 |
| 6,265,297 | B1 | * | 7/2001 | Powell ........................ | 438/592 |
| 6,291,282 | B1 | * | 9/2001 | Wilk et al. .................. | 438/584 |

* cited by examiner

Primary Examiner—John F. Niebling
Assistant Examiner—Walter L. Lindsay, Jr.
(74) Attorney, Agent, or Firm—Morgan, Lewis & Bockius LLP

(57) ABSTRACT

There is disclosed a method of manufacturing a transistor in a semiconductor device. The present invention forms a Ta film or a TaNx film at a low temperature or forms a first TaNx film in which the composition(x) of nitrogen is 0.45~0.55, on a gate insulating film in a NMOS region, so that the work function becomes 4.0~4.4 eV, and also forms a Ta film or a TaNx film at a high temperature or forms a second TaNx film in which the composition(x) of nitrogen is 0.6~1.4 is formed, on a gate insulating film in a PMOS region, so that the work function becomes 4.8~5.2 eV. Thus, the present invention can lower the threshold voltage by implementing a surface channel CMOS device both in the NMOS region and the PMOS region.

69 Claims, 6 Drawing Sheets

METHOD OF MANUFACTURING A TRANSISTOR IN A SEMICONDUCTOR DEVICE

BACKGROUND OF THE INVENTION

1. Field of the Invention

The invention relates generally to a method of manufacturing a transistor in a semiconductor device. More particularly, the invention relates to a method of manufacturing a transistor in a semiconductor device capable of lowering the threshold voltage by implementing a surface channel CMOS device both in the NMOS region and the PMOS region, in such a way that a Ta film or a TaNx film is formed at a low temperature or a first TaNx film in which the composition(x) of nitrogen is 0.45~0.55 is formed, on a gate insulating film in a NMOS region, so that the work function becomes 4.0~4.4 eV, and a Ta film or a TaNx film is formed at a high temperature or a second TaNx film in which the composition(x) of nitrogen is 0.6~1.4 is formed, on a gate insulating film in a PMOS region, so that the work function becomes 4.8~5.2 eV.

2. Description of the Prior Art

In semiconductor devices, a silicon oxide film ($SiO_2$) is mainly used as a gate insulating film in DRAMs and logic devices. As the design rule is reduced, there is a trend that the thickness of the silicon oxide film is reduced below 25~30 Å, which is a tunneling limit.

In case of below 0.1 μm DRAM, it is expected that the thickness of the gate insulating film will be about 30~35 Å. In case of logic devices, on the other hand, it is expected that the thickness of the gate dielectric film will be about 13~15 Å. When the gate electrode is formed of polysilicon, however, as the thickness of the gate insulating film increased electrically by means of a depletion phenomenon of polysilicon is about 3~8 Å, there is a significant obstacle in reducing the thickness ($T_{eff}$) of the effective gate insulating film with about 15~30 Å. Therefore, as one solution to overcome this, a study has recently been made in which a high dielectric constant material is used as a gate insulating film. Meanwhile, there is a study in which the gate electrode is formed of a metal instead of polysilicon in order to minimize the depletion phenomenon of polysilicon.

Also, a lot of studies has recently been made in which the gate electrode is formed of a metal since it can prevent the problem of boron penetration, which is generated when the gate electrode is formed of polysilicon and a junction region is formed using a p-type impurity, for example, boron.

In order to form the gate electrode with a metal, there has been a lot of studies on TiN or WN. However, as they has the work function of 4.75~4.85 eV, the work function is formed near the valence band in the mid-gap work function. It could be said that the work function is an adequate level in case of a surface channel PMOS. In case of NMOS, however, if the channel doping is $2~5\times10^{17}/cm^3$ the threshold voltage is almost 0.8~1.2 V. In other words, in this case, it could not meet the threshold voltage target of 0.3~0.6 V, that is required in high-performance devices having low voltage or low power characteristic. Therefore, in order to obtain a low threshold voltage of about 0.3~0.6 V both in a NMOS and a PMOS, it is preferred that a dual metal electrode having the work function of about 4.0~4.4 eV in case of NMOS and a dual metal electrode having the work function of about 4.8~5.2 eV in case of PMOS are used.

SUMMARY OF THE INVENTION

It is therefore an object of the present invention to provide a method of manufacturing a transistor in a semiconductor device capable of solving the above problem, by forming a metal gate electrode that has a low work function in a NMOS region but has a high work function in a PMOS region.

Another object of the present invention is to provide a method of manufacturing a transistor in a semiconductor device by which a metal gate electrode having a dual work function is formed by using the fact that the work function of a Ta film or a TaNx film is changed depending on the deposition temperature.

Still another object of the present invention is to provide a method of manufacturing a transistor in a semiconductor device by which a metal gate electrode having a dual work function is formed by using the fact that the work function of a TaNx film is changed depending on the composition of nitrogen.

In order to accomplish the above object, a method of manufacturing a transistor in a semiconductor device according to a first embodiment of the present invention is characterized in that it comprises the steps of injecting each of first impurity and second impurities into given regions of a semiconductor substrate to define a first region and a second region; forming a gate insulating film on the semiconductor substrate in which the first region and the second region are defined; forming a first Ta film having a first work function on the first region; forming a second Ta film having a second work function on the second region; forming a metal layer on the entire structure including the first and second Ta films; patterning the metal layer, the first and second Ta films, and the gate insulating film to form gate electrodes in the first and second regions, respectively; and forming a first junction region by injecting a first impurity into the semiconductor substrate in the first region and forming a second junction region by injecting a second impurity into the semiconductor substrate in the second region.

Also, a method of manufacturing a transistor in a semiconductor device according to a second embodiment of the present invention is characterized in that it comprises the steps of injecting each of first impurity and second impurities into given regions of a semiconductor substrate to define a first region and a second region; forming a gate insulating film on the semiconductor substrate in which the first region and the second region are defined; forming a first Ta film having a first nitrogen composition on the first region so that the first Ta film have a first work function; forming a second Ta film having a second nitrogen composition on the second region so that the second Ta film have a second work function; forming a metal layer on the entire structure including the first and second TaNx films; patterning the metal layer, the first and second TaNx films, and the gate insulating film to form gate electrodes in the first and second regions, respectively; and forming a first junction region by injecting a first impurity into the semiconductor substrate in the first region and forming a second junction region by injecting a second impurity into the semiconductor substrate in the second region.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
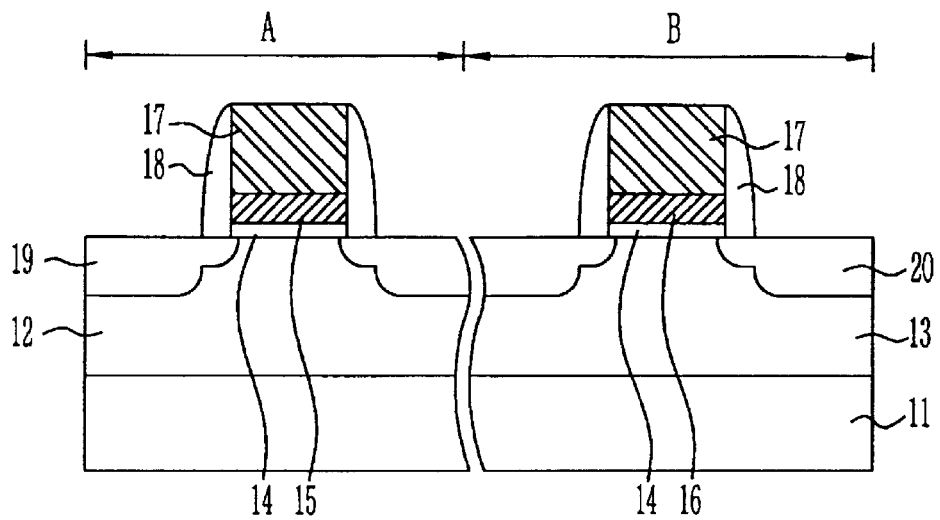
FIG. 1 is a cross-sectional view of a device for illustrating a method of manufacturing a transistor in a semiconductor device according to a first embodiment of the present invention.

The present invention will be described in detail by way of a preferred embodiment with reference to accompanying drawings, in which like reference numerals are used to identify the same or similar parts.

Referring now to FIG. 1, a method of manufacturing a transistor in a semiconductor device according to a first embodiment of the present invention will be below explained in detail.

Referring to FIG. 1, each of a p-type impurity and a n-type impurity is injected into given regions of a semiconductor substrate 11, respectively, to form a p-well 12 and a n-well 13, thus defining a NMOS region A and a PMOS region B. Then, a gate insulating film 14 is formed on the entire structure. Next, a first Ta film or a TaNx film 15 having the work function of about 4.0~4.4 eV is formed on the gate insulating film 14 in the NMOS region A. On the other hand, a second Ta film or a TaNx film 16 having the work function of about 4.8~5.2 eV is formed on the gate insulating film 14 in the PMOS region B. The first and second Ta films or the TaNx films 15 and 16 are formed in thickness of 5~500 Å, respectively. Next, a metal layer 17 having a low resistance such as tungsten is formed on the entire structure. Given portions of the metal layer 17, the first and second Ta films or the TaNx films 15 and 16, and the gate insulating film 14 in the NMOS region A and the PMOS region B are patterned to form gate electrodes, respectively. After injecting a low-concentration n-type impurity into the semiconductor substrate 11 in the NMOS region A, a low-concentration p-type impurity is injected into the PMOS region B. Then, an insulating film is formed on the entire structure and a spacer 18 is then formed on the sidewalls of the gate electrodes each formed in the NMOS region A and the PMOS region B by means of blanket etch process. Next, a high-concentration n-type impurity is injected into the semiconductor substrate 11 in the NMOS region A and a high-concentration p-type impurity is then injected into the PMOS region B. Thereby, a n-type junction region 19 of a LDD structure is formed in the NMOS region A and a p-type junction region 20 of a LDD structure is also formed in the PMOS region B.

In the above, the first and second Ta films or the TaNx films 15 and 16 may be formed by using any one of a sputtering method, a CVD method using a precursor or an advanced CVD method, an atomic layer deposition and a remote plasma CVD.

First, in order for the first Ta film or the TaNx film 15 to have the work function of about 4.0~4.4 eV using the sputtering method, the Ta film is formed at the temperature of 5~400° C. and the TaNx film is formed at the temperature of 5~300° C. At this time, the TaNx film is formed by nitrogen reactive sputtering method by which nitrogen and Ar each having the amount of 0~100 sccm and 5~100 sccm are introduced and a direct current power supply of 0.2~15 kW is also applied, after a Ta target is mounted. On the other hand, in order for the second Ta film or the TaNx film 16 to have the work function of 4.8~5.2 eV, the Ta film is formed at the temperature of 400~500° C. and the TaNx film is also formed at the temperature of 300~600° C. At this time, the TaNx film is formed by nitrogen reactive sputtering method by which nitrogen and Ar each having the amount of 30~200 sccm and 5~30 sccm are introduced and a direct current power supply of 0.25~15 kW is also applied, after a Ta target is mounted. Here, the amount of nitrogen and Ar may be changed depending on the supply power.

Second, in order for the first Ta film or the TaNx film 15 to have the work function of 4.0~4.4 eV using CVD or advanced CVD method using a precursor, the Ta film is formed at the temperature of 200~400° C. and the TaNx film is also formed at the temperature of 100~300° C. On the other hand, in order for the second Ta film or the TaNx film 16 to have the work function of 4.8~5.2 eV, the Ta film is formed at the temperature of 400~700° C. and the TaNx film is also formed at the temperature of 300~700° C. At this time, any one of $TaCl_3$, $Ta(OC_2H_5)_4$, TDMAT and TDEAT may be used ad the Ta precursor and any one of $NH_3$, $N_2$ and $ND_3$ may be also used as the nitrogen source.

Third, in order f the Ta precursor or the first Ta film or the TaNx film 15 to have the work function of 4.0~4.4 eV using an atomic layer deposition, the Ta film is formed at the temperature of 25~300° C. and the TaNx film is also formed at the temperature of 25~250° C. On the other hand, in order for the second Ta film or the TaNx film 16 to have the work function of 4.8~5.2 eV, the Ta film is formed at the temperature of 300~700° C. and the TaNx film is also formed at the temperature of 250~700° C. At this time, any one of $TaCl_3$, $Ta(OC_2H_5)_4$, TDMAT and TDEAT may be used as the Ta precursor and the pressure is in the rage of 0.05~3 Torr. In order to control the content of nitrogen when the first and second Ta films or the TaNx films 15 and 16 are formed using these precursors, a pumping is performed. The pumping may be performed using any one of $NH_3$, $N_2$ and $ND_3$. At this time, the composition of nitrogen may be adjusted by the number of the cycles.

Fourth, in order for the first Ta film or the TaNx film 15 to have the work function of 4.0~4.4 eV using a remote plasma CVD method, the Ta film is formed at the temperature of 25~300° C. and the TaNx film is also formed at the temperature of 25~250° C. On the other hand, in order for the second Ta film or the TaNx film 16 to have the work function of 4.8~5.2 eV, the Ta film is formed at the temperature of 300~700 ° C. and the TaNx film is also formed at the temperature of 250~700° C. At this time, the remote plasma CVD method may use the frequency of 2.0~9.0 GHz and one of He, Ar, Kr and Xe, when the plasma is excited. Also, the relative amount of Ta and N is adjusted by controlling the flow rate of the gas used. At this time, when the remote plasma CVD method is performed, the metal sources are sprayed around the wafer and are then injected into the chamber. Also the nitrogen source is excited around the plasma and is then introduced around the wafer.

The work function can be controlled by forming Ta films or TaNx films each having different deposition temperatures and compositions of nitrogen in the NMOS and PMOS regions in the gate, etc. that is formed using various methods, for example, damascene process, in addition to the above methods.

Figure 2:
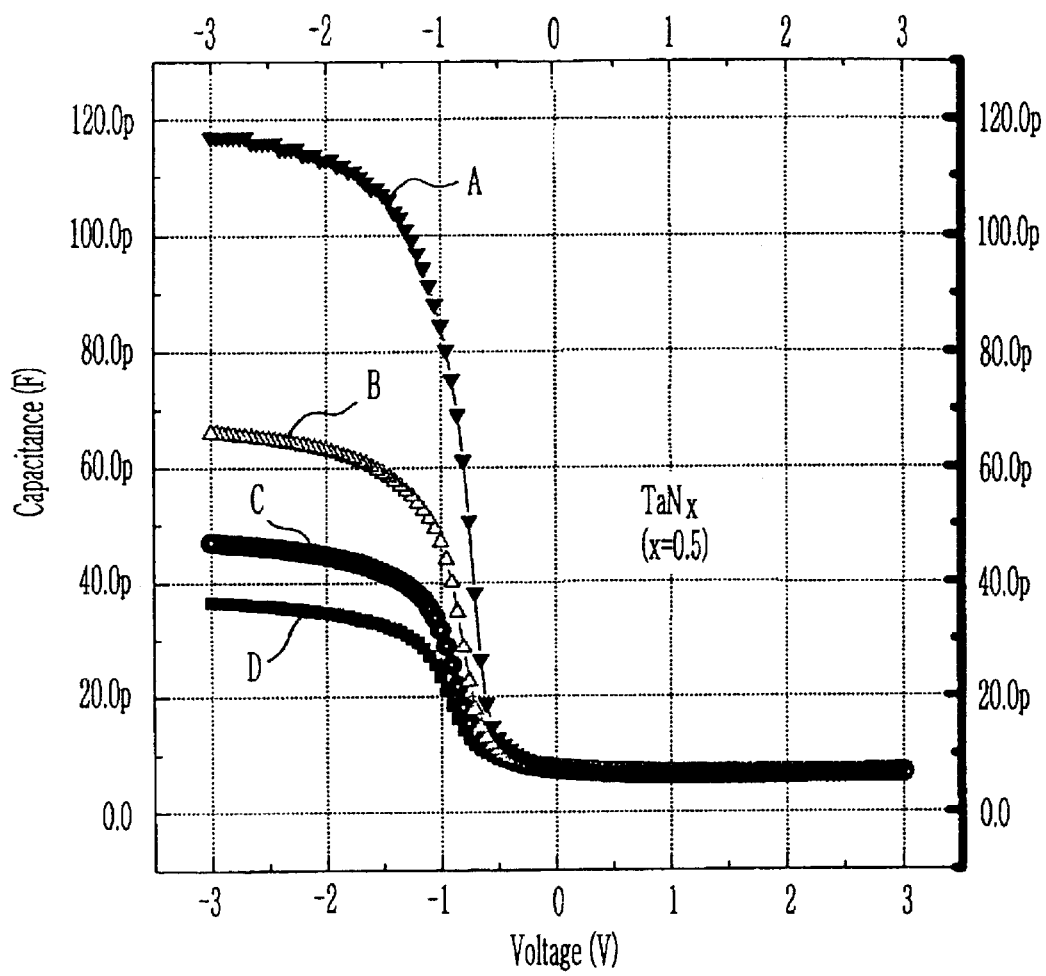
FIG. 2 is a C-V of a TaNx film depending on the thickness of a gate oxide film.

Usually, in order to find the work function of the gate electrode, it is required that the capacitance-voltage (hereinafter called "C-V") curve for the thickness of several gate oxide films is found and each of the flat band voltages for each of the thickness in the C-V is found, as shown in FIG. 2.

FIG. 2 is an exemplary C-V curve of the TaNx(x=0.5) film. In the drawing, A indicates the C-V curve of the TaNx film when the silicon oxide film is 116.1 Å, B indicates that when the silicon oxide film is 205.9 Å, C indicates that when the silicon oxide film is 290.2 Å and D indicates that when the silicon oxide film is 372.7 Å. After that, as in FIG. 3A and FIG. 3B, if it is linearly fitted in the flat band voltage curve depending on the effective gate oxide film thickness ($T_{eff}$), a single straight line is obtained. The value of the intercept by which the straight line and the Y-axis meets corresponds to ($\Phi_{ms}/q$), wherein $\Phi_{ms}$ means the difference between the work function ($\Phi_m$) of a metal and the work function ($\Phi_s$) of a silicon semiconductor.

Figure 3A:
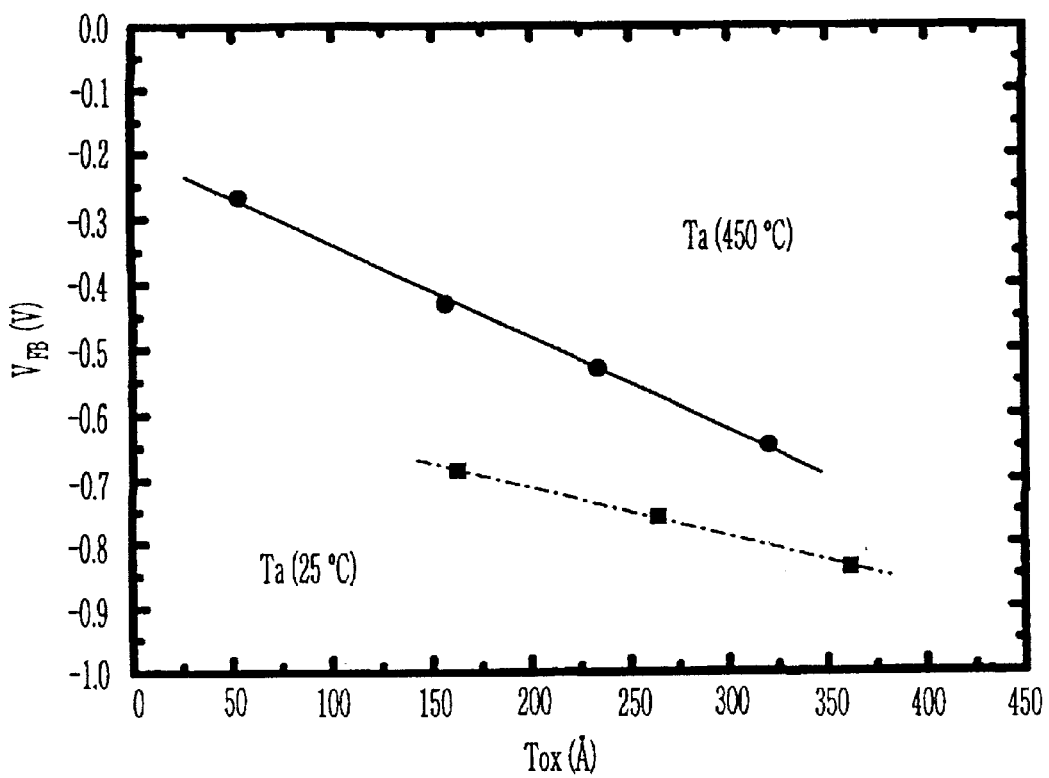
FIG. 3A and FIG. 3B are effective gate oxide film thickness depending on the deposition temperature of a Ta film and a TaNx film, and a flat band voltage graph accordingly.
Figure 3B:
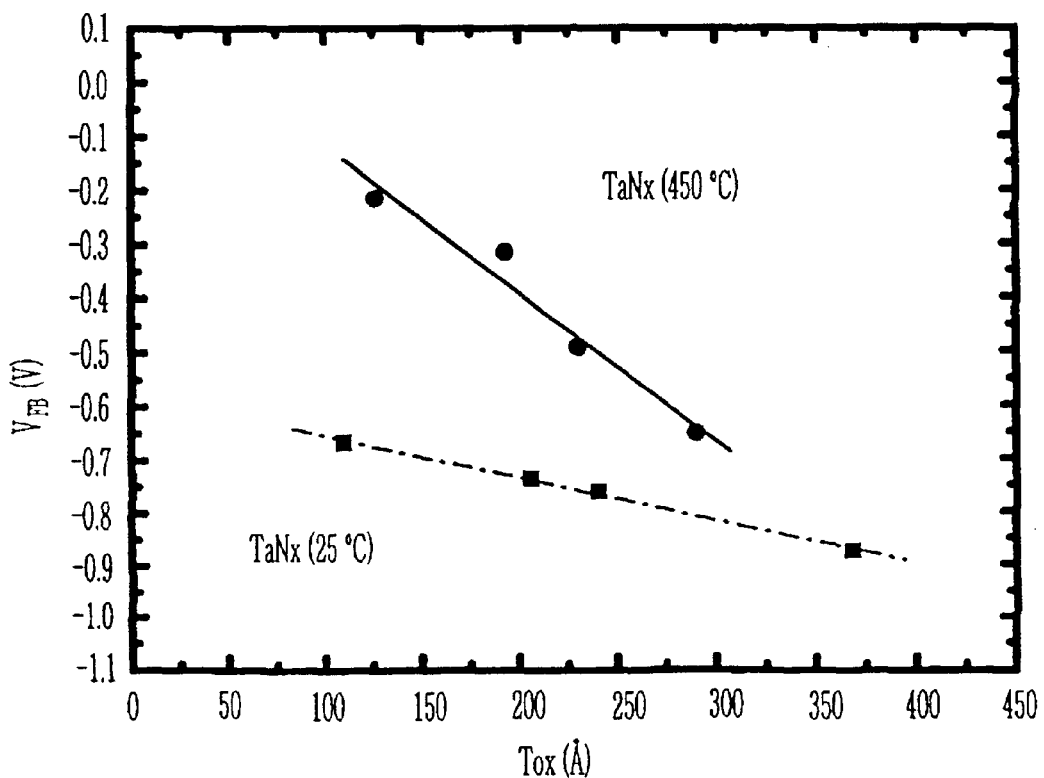

FIG. 3A shows the case that Ta is deposited at the temperature of 25° C. and 450° C., FIG. 3B shows the case that TaNx(x=0.8) is deposited at the temperature of 25° C. and 450° C.

TABLE 1

|  | 25° C. | 450° C. | Difference Value (Δ) |
|---|---|---|---|
| Ta | 4.37 eV | 4.83 eV | 0.47 eV |
| TaNx (x = 0.3) | 4.27 eV | 4.48 eV | 0.21 eV |
| TaNx (x = 0.5) | 4.28 eV | 4.36 eV | 0.08 eV |
| TaNx (x = 0.8) | 4.35 eV | 5.09 eV | 0.74 eV |
| TaNx (x = 1.3) | 4.50 eV | 5.16 eV | 0.66 eV |

[Table 1] shows the changes of each of the work functions ($\Phi_m$) depending on the sputtering deposition temperatures of the Ta film and the TaNx film, which are experimentally obtained by the above method. As can be seen from the table, the Ta film shows the work function of 4.37 eV in case that the deposition temperature is 25° C., while showing the work function of 4.83 eV in case that the deposition temperature is over 450° C. On the other hand, it can be seen that the TaNx film shows the work function of 4.27~4.50 eV in case that the deposition temperature is 25° C., while showing the work function of 4.48~5.16 eV in case that the deposition temperature is 450° C. The reason why the work function of the Ta film or the TaNx film is significantly varied depending on the deposition temperature will be now examined. This is because when a nucleus is initially created on a thin film, phases are different in the lowest free energy along with the difference of atomic movement in each of the deposition conditions.

Figure 4A:
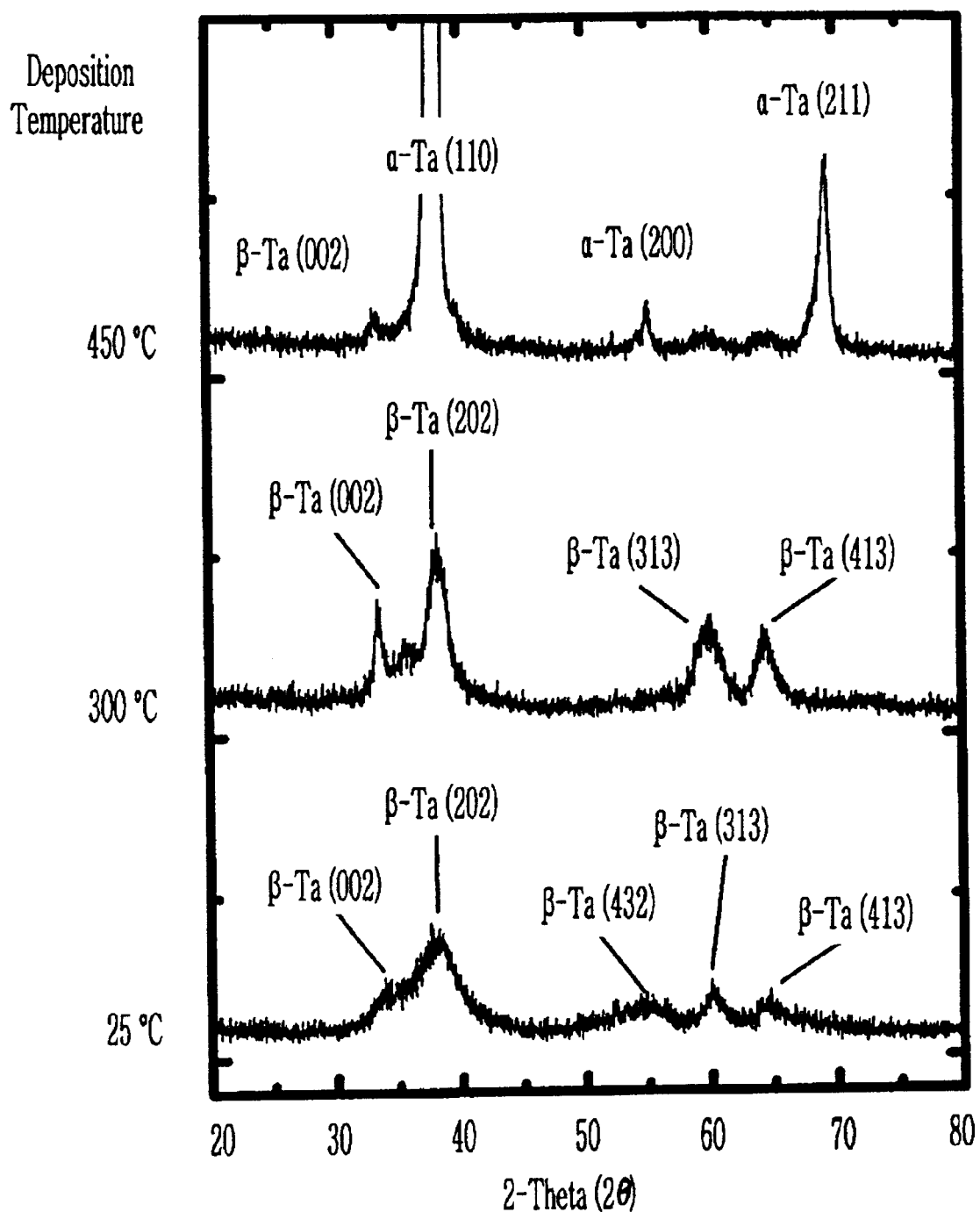
FIG. 4A and FIG. 4B are results of analyzing phases depending on the deposition temperature upon a reactive sputtering of a Ta film and a TaNx film.
Figure 4B:
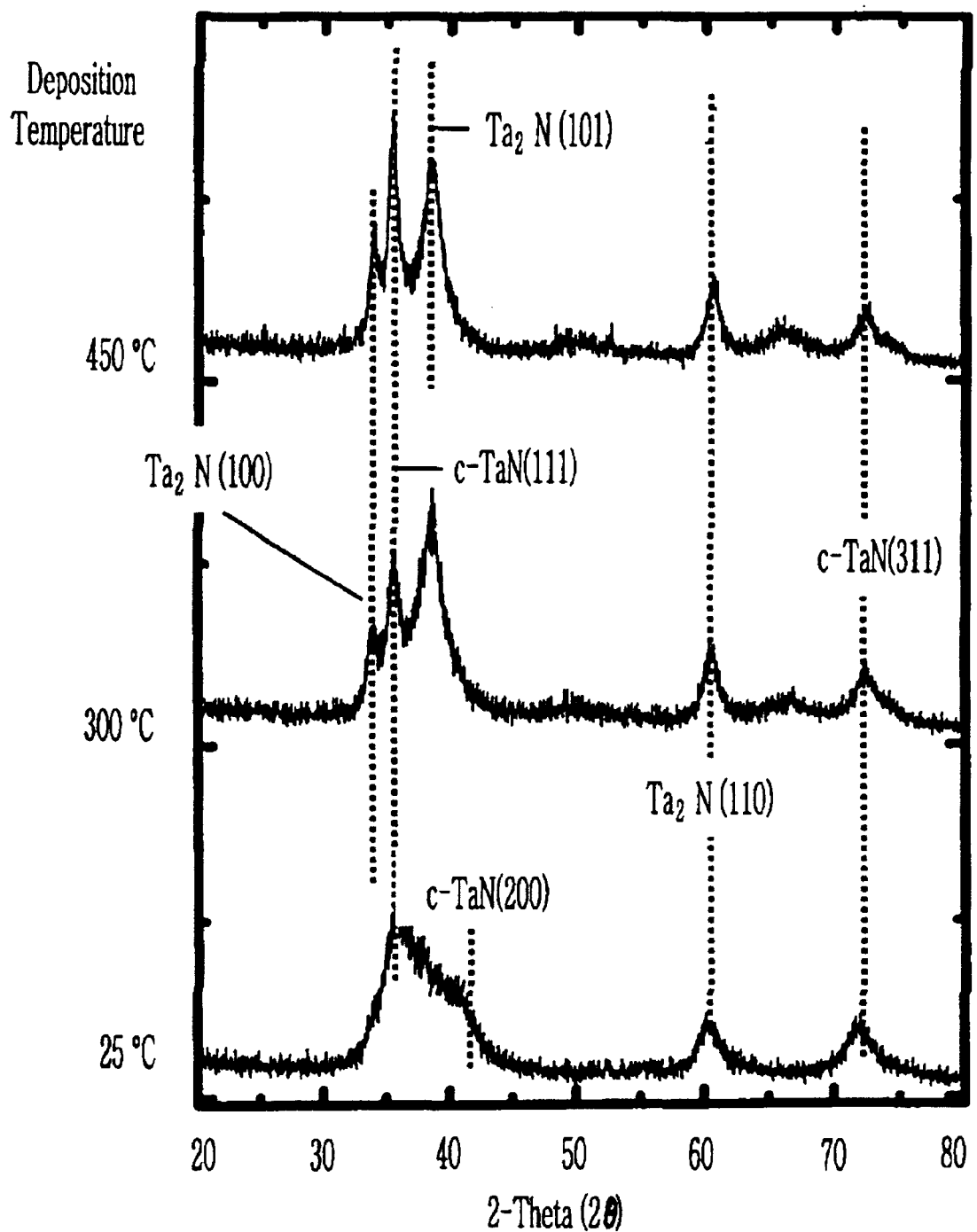

FIG. 4A and FIG. 4B are shiftes in the phases of thin films depending on the deposition temperature upon a reactive sputtering of a Ta film and a TaNx film. As can be seen from FIG. 4A, the phase of the Ta film is shifted at a relatively high deposition temperature of over 450° C., so that an alpha phase is formed. On the contrary, as can be seen from FIG. 4B, the phase of the TaNx film is shifter at a relatively low deposition temperature of 300° C. This means that tantalum the atoms of which are relatively heavy requires the temperature of over 450° C. in order for tantalum to have an activation energy necessary for the phase shift with a sufficient atomic movement. In case of the TaNx film, as nitrogen being light atoms easily exits from the thin film at a relatively low temperature, a Ta2N phase containing a relatively low nitrogen concentration is created and a phase in which TaNx and Ta2N co-exist is created. Also, the direction of the TaNx film is changed from the face (200) to (111) depending on the deposition temperature. This change in the direction of the TaNx film greatly affects the work function along with the shift in the phase depending on the atomic movement.

Figure 5:
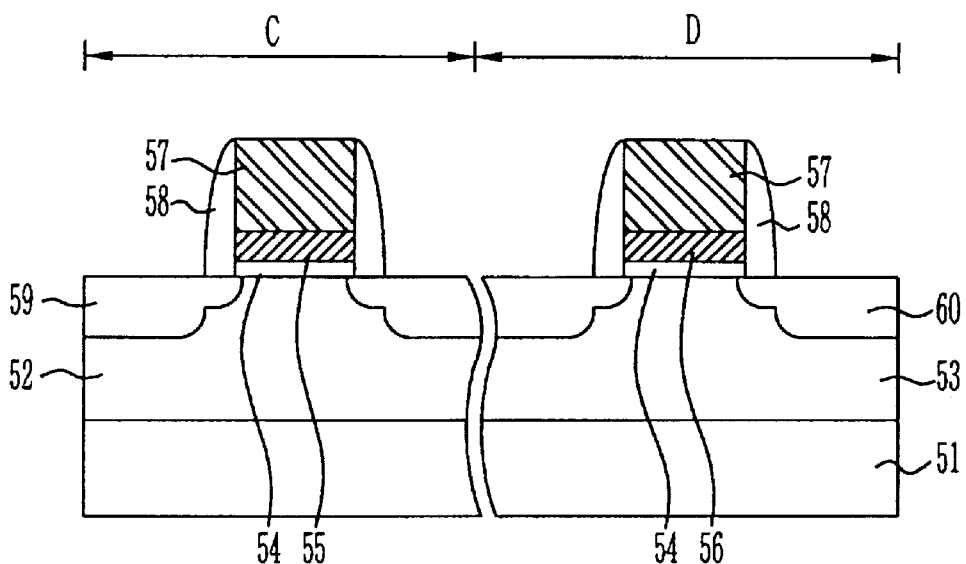
FIG. 5 is a cross-sectional view of a device for illustrating a method of manufacturing a transistor in a semiconductor device according to a second embodiment of the present invention.

FIG. 5 is a cross-sectional view of a device for illustrating a method of manufacturing a transistor in a semiconductor device according to a second embodiment of the present invention;

Referring to FIG. 5, each of a p-type impurity and a n-type impurity is injected into given regions of a semiconductor substrate 51, respectively, to form a p-well 52 and a n-well 53, thus defining a NMOS region C and a PMOS region D. Then, a gate insulating film 54 is formed on the entire structure. Next, a first TaNx film 55 having the work function of about 4.0~4.4eV and the composition (x) of nitrogen of 0.45~0.55 is formed on the gate insulating film 54 in the NMOS region C. On the other hand, a second TaNx film 56 having the work function of about 4.8~5.2 eV and the composition (x) of nitrogen of 0.6~1.6 is formed on the gate insulating film 54 in the PMOS region D. The first and second TaNx films 55 and 56 are formed in thickness of 5~500 Å, respectively. Next, a metal layer 57 having a low resistance such as tungsten is formed on the entire structure. Given portions of the metal layer 57, the first and second TaNx films 55 and 56, and the gate insulating film 54 in the NMOS region C and the PMOS region D are patterned to form gate electrodes, respectively. After injecting a low-concentration n-type impurity into the semiconductor substrate 51 in the NMOS region C, a low-concentration p-type impurity is injected into the PMOS region D. Then, an insulating film is formed on the entire structure and a spacer 58 is then formed on the sidewalls of the gate electrodes each formed in the NMOS region C and the PMOS region D by means of a blanket etch process. Next, a high-concentration n-type impurity is injected into the semiconductor substrate 51 in the NMOS region C and a high-concentration p-type impurity is then injected into the PMOS region D. Thereby, a n-type junction region 59 of a LDD structure is formed in the NMOS region C and a p-type junction region 60 of a LDD structure is also formed in the PMOS region D.

In the above, the first and second TaNx films 55 and 56 may be formed by using any one of a sputtering method, a CVD method using a precursor or an advanced CVD method, an atomic layer deposition and a remote plasma CVD.

In order for the first TaNx film 55 to have the work function of about 4.0~4.4 eV using a sputtering method, after a Ta target is mounted, a nitrogen reactive sputtering method is performed by which nitrogen and Ar each having the amount of 0.1~100 sccm and 5~100sccm are introduced and a direct current power supply of 0.2~15 kW is applied. On the other hand, in order for the second TaNx film 56 to have the work function of 4.8~5.2 eV, after a Ta target is mounted, a nitrogen reactive sputtering method is performed by which nitrogen and Ar each having the amount of 30~200 sccm and 5~30 sccm are introduced and a direct current power supply of 0.25~15 kW is applied. Here, the amount of nitrogen and Ar may be changed depending on the supply power.

First, in order to form the first and second TaNx films 55 and 56 using a CVD method or an advanced CVD method using a precursor, any one of TaCl$_3$, Ta(OC$_2$H$_5$)$_4$, TDMAT and TDEAT may be used as the Ta precursor and any one of NH$_3$, N$_2$ and ND$_3$ may be used as the nitrogen source. At this time, in order to form the first TaNx film 55, the nitrogen source about 0.45~0.55 times than that of the Ta precursor is introduced. Also, in order to form the second TaNx film 56, the nitrogen source about 0.6~1.4 times than that of the Ta precursor is introduced.

Second, in case of using an atomic layer deposition method, the first and second TaNx films 55 and 56 may be formed at the temperature of 50~650° C. and under the pressure 0.05~3 Torr ° C., using any one of TaCl$_3$, Ta(OC$_2$H$_5$)$_4$, TDMAT and TDEAT as a Ta precursor. At this time, in order to control the contents of nitrogen, a pumping may be performed using one of NH$_3$, N$_2$ and ND$_3$. At this time, the composition of nitrogen may be adjusted by the number of the cycles. Also, in order to form the first TaNx film 55, the nitrogen source about 0.45~0.55 times than that of the Ta precursor is introduced. Also, in order to form the second TaNx film 56, the nitrogen source about 0.6~1.4 times than that of the Ta precursor is introduced.

Third, in order to form the first and second TaNx film 55 and 56 using a remote plasma CVD method, any one of TaCl$_3$, Ta(OC$_2$H$_5$)$_4$, TDMAT and TDEAT may be used as a Ta precursor. At this time, in order to control the contents of nitrogen, a pumping using one of NH$_3$, N$_2$ and ND$_3$ may be performed. Also, in case of using electron cyclotron resonance (ECR) as a plasma source for remote plasma, the frequency of 2.0~9.0 GHz may be used and one of He, Ar, Kr and Xe may be used in order to excite the plasma. Further, the relative amounts of Ta and N are adjusted by controlling the flow rate of the gas used. At this time, in case that the remote plasma CVD method is used, the metal sources are sprayed around the wafer and are then injected into the chamber. Also the nitrogen source is excited around the plasma and is then introduced around the wafer. In order to form the first TaNx film 55, the nitrogen source about 0.45~0.55 times than that of the Ta precursor is introduced. Also, in order to form the second TaNx film 56, the nitrogen source about 0.6~1.4 times than that of the Ta precursor is introduced.

The work function can be controlled by forming TaNx films each having different compositions of nitrogen in the NMOS and PMOS regions in the gate, etc. that is formed using various methods, for example, damascene process, in addition to the above methods.

Figure 6:
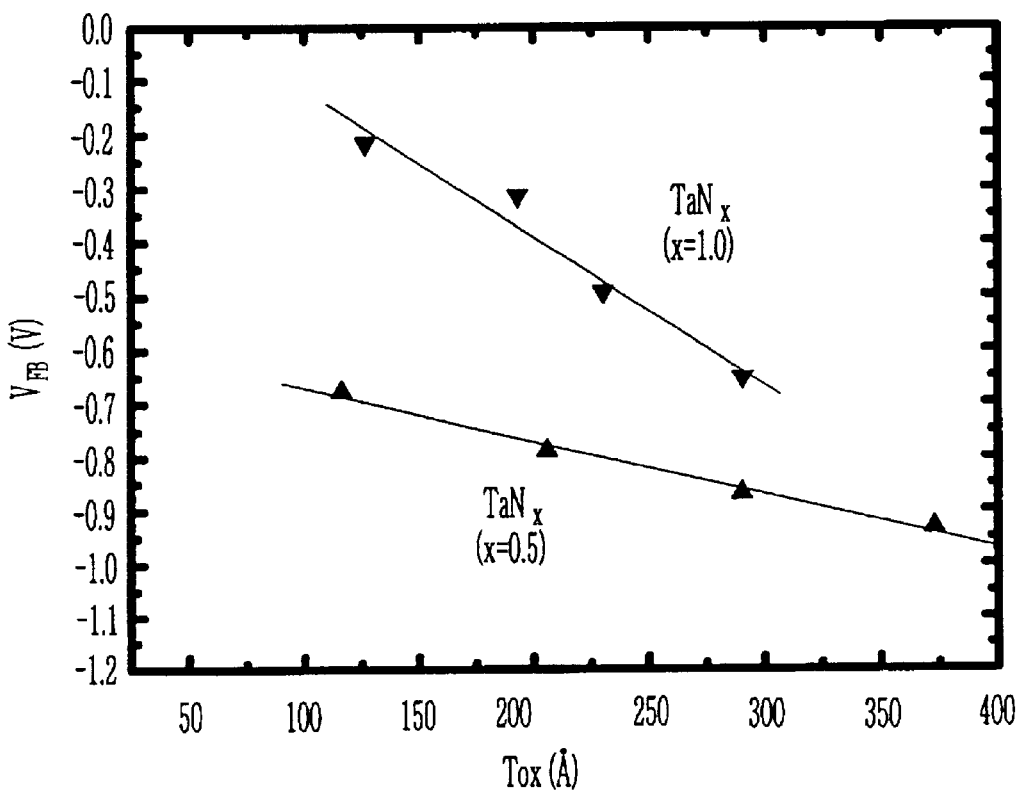
FIG. 6 is the effective thickness of the gate oxide film depending on the composition of nitrogen in the TaNx film, and a flat band voltage graph accordingly.

FIG. 6 is a flat band voltage curve depending on the effective thickness of the gate oxide film (T$_{eff}$) in case that x in the TaNx film is 0.5 and 1.0. It shows the case that ($\Phi_{ms}$/q) is obtained by linearly fitting the flat band voltage curve to the capacitance-voltage curve depending on the thickness of the gate oxide film explained in FIG. 2.

TABLE 2

| Nitrogen composition (x) | Work function ($\phi_m$) |
|---|---|
| 0.0~0.2 eV | 4.45~4.73 eV |
| 0.45~0.55 eV | 4.20~4.40 eV |
| 0.6~1.4 eV | 5.0~5.20 eV |

[Table 2] shows the work function ($\Phi_m$) depending on the composition of nitrogen in the TaNx film that is experimentally obtained by the above method. In case that the composition (x) of nitrogen is 0.0~0.2, the work function is 4.45~4.73 eV. In case that the composition (x) of nitrogen is 0.45~0.55, the work function is 4.20~4.40 eV. Also, in case that the composition (x) of nitrogen is 0.6~1.4, the work function is 5.0~5.20 eV. As such, the reason why the work function is changed depending on the contents of nitrogen is the change in the phase depending on the contents of nitrogen within the TaNx film.

Figure 7:
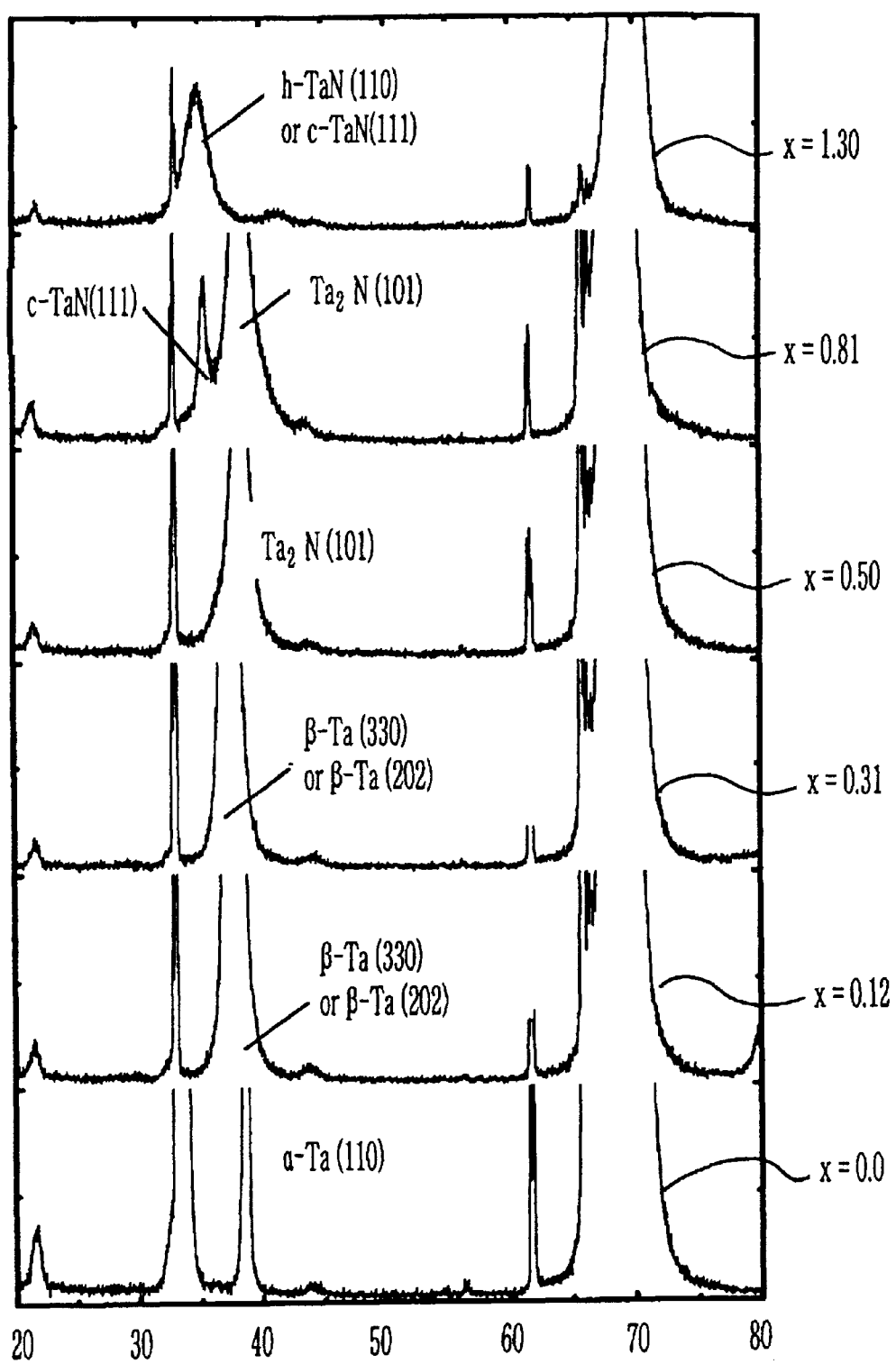
FIG. 7 is a result of analysis into the change in the phase depending on the contents of nitrogen in a TaNx film.

FIG. 7 is a result of analysis into the change in the phase depending on the contents of nitrogen in thea TaNx film. From the drawing, it can be seen that in case that TaNx contains nitrogen that is insufficient to form Ta2N(x=0.5), Ta series phase such as α-Ta or β-Ta is mainly formed, while in case that TaNx contains more nitrogen than that Ta2N contains (x=more than 0.6), TaN having cubic or hexagonal structure is formed.

As a result, it can be seen that a CMOS metal gate electrode having a dual work function can be implemented by controlling the contents of nitrogen within the TaNx film. In other words, in using the TaNx film as the gate electrode, the TaNx film in which nitrogen of 0.45~0.55 is contained is used in the NMOS region, and the TaNx film in which nitrogen of 0.6~1.4 is contained is used in the PMOS region.

In the above, though the present invention has been explained taking the CMOS transistor as an example, it should be noted that the present invention can be applied to a PMOS transistor or a NMOS transistor, respectively.

As mentioned above, the present invention forms a Ta film or a TaNx film at different temperatures or forms first and second TaNx films having different compositions of nitrogen, so that the work function becomes 4.0~4.4 eV on the gate insulating film in the NMOS region and the work function becomes 4.8~5.2 eV on the gate insulating film in the PMOS region. Therefore, the present invention can lower the threshold voltage by implementing a surface channel CMOS device both in the NMOS region and the PMOS region.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed are:

1. A method of manufacturing a transistor in a semiconductor device, comprising the steps of:

injecting each of first impurity and second impurity into given regions of a semiconductor substrate to define a first region and a second region;

forming a gate insulating film on said semiconductor substrate in which said first region and said second region are defined;

forming a first Ta film having a first work function on said first region;

forming a second Ta film having a second work function on said second region;

forming a metal layer on the entire structure including said first and second Ta films;

patterning said metal layer, said first and second Ta films, and said gate insulating film to form gate electrodes in said first and second regions, respectively; and forming a first junction region by injecting the first impurity into said semiconductor substrate in said first region and forming the second junction region by injecting a second impurity into said semiconductor substrate in said second region, wherein said first work function of said first Ta film is smaller than said second work function of said second Ta film, and said first and second Ta films are formed using one of $TaCl_3$, $Ta(OC_2H_5)_4$, TDMAT and TDEAT as a Ta precursor and using one of $NH_3$, $N_2$ and $ND_3$ as a nitrogen source.

2. The method of manufacturing a transistor in a semiconductor device according to claim 1, wherein said first work function is in the range of 4.0~4.4 eV.

3. The method of manufacturing a transistor in a semiconductor device according to claim 1, wherein said second work function is in the range of 4.8~5.2 eV.

4. The method of manufacturing a transistor in a semiconductor device according to claim 1, wherein a first TaNx film is formed instead of said first Ta.

5. The method of manufacturing a transistor in a semiconductor device according to claim 1, wherein a second TaNx film is formed instead of said second Ta film.

6. The method of manufacturing a transistor in a semiconductor device according to claim 1, wherein said first Ta film is formed in thickness of 5~500 Å.

7. The method of manufacturing a transistor in a semiconductor device according to claim 1, wherein said second Ta film is formed in thickness of 5~500 Å.

8. The method of manufacturing a transistor in a semiconductor device according to claim 4, wherein said first TaNx film is formed in thickness of 5~500 Å.

9. The method of manufacturing a transistor in a semiconductor device according to claim 5, wherein sad second TaNx film is formed in thickness of 5~500 Å.

10. The method of manufacturing a transistor in a semiconductor device according to claim 1, wherein said first Ta film is formed using any one of a sputtering method, a CVD method or an advanced CVD method, an atomic layer deposition method and a remote plasma CVD.

11. The method of manufacturing a transistor in a semiconductor device according to claim 1, wherein said second Ta film is formed using any one of a sputtering method, a CVD method or an advanced CVD method, an atomic layer deposition method and a remote plasma CVD.

12. The method of manufacturing a transistor in a semiconductor device according to claim 4, wherein sad first TaNx film is formed using any one of a sputtering method, a CVD) method or an advanced CVD method, an atomic layer deposition method and a remote plasma CVD.

13. The method of manufacturing a transistor in a semiconductor device according to claim 5, wherein said second TaNx film is formed using any one of a sputtering method, a CVD method or an advanced CVD method, an atomic layer deposition method and a remote plasma CVD.

14. The method of manufacturing a transistor in a semiconductor device according to claim 10, wherein said sputtering method is performed at the temperature of 5~400° C.

15. The method of manufacturing a transistor in a semiconductor device according to claim 10, wherein said CVD method or said advanced CVD method is performed at the temperature of 200–400° C.

16. The method of manufacturing a transistor in a semiconductor device according to claim 10, wherein said atomic layer deposition method is performed at the temperature of 25~300° C.

17. The method of manufacturing a transistor in a semiconductor device according to claim 10, wherein said remote plasma CVD method is performed at the temperature of 25~300° C. using the frequency of 2.0~9.0 GHz.

18. The method of manufacturing a transistor in a semiconductor device according to claim 11, wherein said sputtering method is performed at the temperature of 400~500° C.

19. The method of manufacturing a transistor in a semiconductor device according to claim 10, wherein said CVD method or said advanced CVD method is performed at the temperature of 400~700° C. using one of $TaCl_3$, $Ta(OC_2H_5)_4$, TDMAT and TDEAT as a Ta precursor and using one of $NH_3$, $N_2$ and $ND_3$ as a nitrogen source.

20. The method of manufacturing a transistor in a semiconductor device according to claim 11, wherein said atomic layer deposition method is performed at the temperature of 300~700° C. using one of $TaCl_3$, $Ta(OC_2H_5)_4$, TDMAT and TDEAT as a Ta precursor.

21. The method of manufacturing a transistor in a semiconductor device according to claim 11, wherein said remote plasma CVD method is performed at the temperature of 300~700° C. using the frequency of 2.0~9.0 GHz.

22. The method of manufacturing a transistor in a semiconductor device according to claim 12, wherein said sputtering method is performed at the temperature of 5~300° C.

23. The method of manufacturing a transistor in a semiconductor device according to claim 12, wherein said CVD method or said advanced CVD method is performed at the temperature of 100~300° C. using one of $TaCl_3$, $Ta(OC_2H_5)_4$, TDMAT and TDEAT as a Ta precursor and using one of $NH_3$, $N_2$ and $ND_3$ as a nitrogen source.

24. The method of manufacturing a transistor in a semiconductor device according to claim 12, wherein said atomic layer deposition method is performed at the temperature of 25~250° C. using one of $TaCl_3$, $Ta(OC_2H_5)_4$, TDMAT and TDEAT as a Ta precursor.

25. The method of manufacturing a transistor in a semiconductor device according to claim 12, wherein said remote plasma CVD method is performed at the temperature of 25~250° C. using the frequency of 2.0~9.0 GHz.

26. The method of manufacturing a transistor in a semiconductor device according to claim 13, wherein said sputtering method is performed at the temperature of 300~600° C.

27. The method of manufacturing a transistor in a semiconductor device according to claim 13, wherein said CVD method or said advanced CVD method is performed at the temperature of 300~700° C. using one of $TaCl_3$, $Ta(OC_2H_5)_4$, TDMAT and TDEAT as a Ta precursor and using one of $NH_3$, $N_2$ and $ND_3$ as a nitrogen source.

28. The method of manufacturing a transistor in a semiconductor device according to claim 13, wherein said atomic layer deposition method is performed at the temperature of 250~700° C. using one of $TaCl_3$, $Ta(OC_2H_5)_4$, TDMAT and TDEAT as a Ta precursor.

29. The method of manufacturing a transistor in a semiconductor device according to claim 13, wherein said remote plasma CVD method is performed at the temperature of 250~700° C. using the frequency of 2.0~9.0 GHz.

30. The method of manufacturing a transistor in a semiconductor device according to claim 22, wherein said sputtering method is performed by introducing nitrogen of 0.1~100 sccm and argon of 5~100 sccm and by applying a direct current power supply current of 0.2~50 kW.

31. The method of manufacturing a transistor in a semiconductor device according to claim 26, wherein said sputtering method is performed by introducing nitrogen of 0.1~100 sccm and argon of 5~100 sccm and by applying a direct current power supply current of 0.2~50 kW.

32. The method of manufacturing a transistor in a semiconductor device according to claim 16, wherein a pump is performed using one of $N_3$, $N_2$ and $ND_3$ during the atomic layer deposition method.

33. The method of manufacturing a transistor in a semiconductor device according to claim 20, wherein a pump is performed using one of $N_3$, $N_2$ and $ND_3$ during the atomic layer deposition method.

34. The method of manufacturing a transistor in a semiconductor device according to claim 24, wherein a pump is performed using one of $NH_3$, $N_2$ and $ND_3$ during the atomic layer deposition method.

35. The method of manufacturing a transistor in a semiconductor device according to claim 28, wherein a pump is performed using one of $NH_3$, $N_2$ and $ND_3$ during the atomic layer deposition method.

36. The method of manufacturing a transistor in a semiconductor device according to claim 17, wherein plasma is excited by using one of He, Ar, Kr and Xe.

37. The method of manufacturing a transistor in a semiconductor device according to claim 21, wherein plasma is excited by using one of He, Ar, Kr and Xe.

38. The method of manufacturing a transistor in a semiconductor device according to claim 25, wherein plasma is excited by using one of He, Ar, Kr and Xe.

39. The method of manufacturing a transistor in a semiconductor device according to claim 29, wherein plasma is excited by using one of He, Ar, Kr and Xe.

40. A method of manufacturing a transistor in a semiconductor device, comprising the steps of:
   injecting each of first impurity and second impurity into given regions of a semiconductor substrate to define a first region and a second region;
   forming a gate insulating film on said semiconductor substrate in which said first region and said second region are defined;
   forming a first Ta film having a first nitrogen composition on said first region so that the first Ta film has a first work function;
   forming a second Ta film having a second nitrogen composition on said second region so that the second Ta film has a second work function;
   forming a metal layer on the entire structure including said first and second TaNx films;
   patterning said metal layer, said first and second TaNx films, and said gate insulating film to form gate electrodes in said first and second regions, respectively; and
   forming a first junction region by injecting the first impurity into said semiconductor substrate in said first region and forming a second junction region by injecting the second impurity into said semiconductor substrate in said second region,
   wherein said first work function of said first Ta film is smaller than said second work function of said second Ta film, and said first and second Ta films are formed using one of $TaCl_3$, $Ta(OC_2H_5)_4$, TDMAT and TDEAT as a Ta precursor and using one of $NH_3$, $N_2$ and $ND_3$ as a nitrogen source.

41. The method of manufacturing a transistor in a semiconductor device according to claim 40, wherein said first work function is in the range of 4.0~4.4 eV.

42. The method of manufacturing a transistor in a semiconductor device according to claim 40, wherein said second work function is in the range of 4.8~5.2 eV.

43. The method of manufacturing a transistor in a semiconductor device according to claim 40, wherein said nitrogen composition (x) of said first TaNx film is in the range of 0.45~0.55.

44. The method of manufacturing a transistor in a semiconductor device according to claim 40, wherein said nitrogen composition (x) of said second TaNx film is in the range of 0.6~1.4.

45. The method of manufacturing a transistor in a semiconductor device according to claim 40, wherein each of said first and second TaNx films is formed in thickness of 5~500 Å, respectively.

46. The method of manufacturing a transistor in a semiconductor device according to claim 40, wherein said first TaNx film is formed using any one of a sputtering method, a CVD method or an advanced CVD method, an atomic layer deposition method and a remote plasma CVD.

47. The method of manufacturing a transistor in a semiconductor device according to claim 40, wherein said second TaNx film is formed using any one of a sputtering method, a CVD method or an advanced CVD method, an atomic layer deposition method and a remote plasma CVD.

48. The method of manufacturing a transistor in a semiconductor device according to claim 46, wherein said sputtering method is performed by introducing nitrogen of 0.1~100 sccm and argon of 5~100 sccm and by applying a direct current power supply current of 0.25~15 kW, after a Ta target is mounted.

49. The method of manufacturing a transistor in a semiconductor device according to claim 46, wherein said nitrogen source is introduced by about 0.45~0.55 times than that of said Ta precursor.

50. The method of manufacturing a transistor in a semiconductor device according to claim 46, wherein said atomic layer deposition method is performed at the temperature of 50–650° C. under the pressure of 0.05–3 Torr.

51. The method of manufacturing a transistor in a semiconductor device according to claim 46, wherein said atomic layer deposition method performs a pumping using one of $NH_3$, $N_2$ and $ND_3$ in order to control the contents of nitrogen.

52. The method of manufacturing a transistor in a semiconductor device according to claim 50, wherein said nitrogen source is introduced by about 0.45~0.55 times than that of said Ta precursor.

53. The method of manufacturing a transistor in a semiconductor device according to claim 51, wherein said nitrogen source is introduced by about 0.45~0.55 times than that of said Ta precursor.

54. The method of manufacturing a transistor in a semiconductor device according to claim 46, wherein said remote plasma CVD method is performed by using one of $TaCl_3$, $Ta(OC_2H_5)_4$, TDMAT and TDEAT as a Ta precursor.

55. The method of manufacturing a transistor in a semiconductor device according to claim 46, wherein said remote plasma CVD method performs a pumping using one of $NH_3$, $N_2$ and $ND_3$ in order to control the contents of nitrogen.

56. The method of manufacturing a transistor in a semiconductor device according to claim 46, wherein said remote plasma CVD method uses the frequency of 2.0~9.0 GHz and uses one of He, Ar, Kr and Xe gases in order to excite plasma.

57. The method of manufacturing a transistor in a semiconductor device according to claim 54, wherein said nitrogen source is introduced by about 0.45~0.55 times than that of said Ta precursor.

58. The method of manufacturing a transistor in a semiconductor device according to claim 55, wherein said nitrogen source is introduced by about 0.45~0.55 times than that of said Ta precursor.

59. The method of manufacturing a transistor in a semiconductor device according to claim 47, wherein said sputtering method is performed by introducing nitrogen of 30~200 sccm and argon of 5~30 sccm, respectively, and by applying a direct current power supply current of 0.25~15 kW, after a Ta target is mounted.

60. The method of manufacturing a transistor in a semiconductor device according to claim 47, wherein said CVD method or said advanced CVD method is performed, using one of $TaCl_3$, $Ta(OC_2H_5)_4$, TDMAT and TDEAT as a Ta precursor and using one of $NH_3$, $N_2$ and $ND_3$ as a nitrogen source.

61. The method of manufacturing a transistor in a semiconductor device according to claim 60, wherein said nitrogen source is introduced by about 0.6~1.4 times than that of said Ta precursor.

62. The method of manufacturing a transistor in a semiconductor device according to claim 47, wherein said atomic layer deposition method is performed at the temperature of 50~650° C. under the pressure of 0.05~3 Torr, using one of $TaCl_3$, $Ta(OC_2H_5)_4$, TDMAT and TDEAT as a Ta precursor.

63. The method of manufacturing a transistor in a semiconductor device according to claim 47, wherein said atomic layer deposition method performs a pumping using one of $NH_3$, $N_2$ and $ND_3$ in order to control the contents of nitrogen.

64. The method of manufacturing a transistor in a semiconductor device according to claim 62, wherein said nitrogen source is introduced by about 0.6~1.4 times than that of said Ta precursor.

65. The method of manufacturing a transistor in a semiconductor device according to claim 63, wherein said nitrogen source is introduced by about 0.6~1.4 times than that of said Ta precursor.

66. The method of manufacturing a transistor in a semiconductor device according to claim 47, wherein said remote plasma CVD method is performed by using one of $TaCl_3$, $Ta(OC_2H_5)_4$, TDMAT and TDEAT as a Ta precursor.

67. The method of manufacturing a transistor in a semiconductor device according to claim 47, wherein said remote plasma CVD method performs a pumping using one of $NH_3$, $N_2$ and $ND_3$ in order to control the contents of nitrogen.

68. The method of manufacturing a transistor in a semiconductor device according to claim 47, wherein said remote plasma CVD method uses the frequency of 2.0~9.0 GHz and uses one of He, Ar, Kr and Xe gases in order to excite plasma.

69. The method of manufacturing a transistor in a semiconductor device according to claim 66 or 67, wherein said nitrogen source is introduced by about 0.6~1.4 times than that of said Ta precursor.

* * * * *